US012743056B2

(12) United States Patent
Van Bockel

(10) Patent No.: US 12,743,056 B2
(45) Date of Patent: Sep. 22, 2026

(54) DELAY LINE CALIBRATION METHOD

(71) Applicant: MAGICS TECHNOLOGIES, Geel (BE)

(72) Inventor: Bjorn Van Bockel, Merksplas (BE)

(73) Assignee: MAGICS TECHNOLOGIES, Geel (BE)

( * ) Notice: Subject to any disclaimer, the term of this patent is extended or adjusted under 35 U.S.C. 154(b) by 63 days.

(21) Appl. No.: 18/881,610

(22) PCT Filed: Jul. 6, 2023

(86) PCT No.: PCT/EP2023/068733
§ 371 (c)(1),
(2) Date: Jan. 6, 2025

(87) PCT Pub. No.: WO2024/008876
PCT Pub. Date: Jan. 11, 2024

(65) Prior Publication Data

US 2025/0315012 A1 Oct. 9, 2025

(30) Foreign Application Priority Data

Jul. 7, 2022 (EP) .................................... 22183698

(51) Int. Cl.
*H03K 5/00* (2006.01)
*G04F 10/00* (2006.01)
(Continued)

(52) U.S. Cl.
CPC ............. *G04F 10/005* (2013.01); *H03K 5/14* (2013.01); *H03L 7/085* (2013.01); *H03K 2005/00026* (2013.01)

(58) Field of Classification Search
CPC ........ G04F 10/06; G04F 10/04; G04F 10/105; G04F 10/005; H03M 1/50; H03M 5/502;
(Continued)

(56) References Cited

U.S. PATENT DOCUMENTS 7,813,462 B2 10/2010 de Obaldia et al.
7,928,888 B1 * 4/2011 Chiu .................... G04F 10/005 341/161

(Continued)

FOREIGN PATENT DOCUMENTS

DE 102008015791 B4 5/2012

OTHER PUBLICATIONS

Henzler, Stephan et al., "A Local Passive Time Interpolation Concept for Variation-Tolerant High-Resolution Time-to-Digital Conversion", IEEE Journal of Solid-State Circuits, Jun. 24, 2008, pp. 1666-1676, vol. 43, No. 7.

(Continued)

*Primary Examiner* — Tuan T Lam
(74) *Attorney, Agent, or Firm* — Workman Nydegger

(57) ABSTRACT

A method is for measuring a time lapse between a trigger and a pulse of a clock of a time-to-digital converter (TDC) device. The method includes the steps of: a) providing a delay line signal to a delay line of a TDC device; b) subsequently, at a measurement clock pulse: obtaining a measurement delay line state representing states of the delay cells; c) subsequently and within half a clock period of the measurement clock pulse: basing the delay line signal on a clock signal and providing the delay line signal based on the clock signal to the delay line; d) subsequently, at a calibration clock pulse: obtaining a calibration delay line state representing states of the delay cells, and e) computing the time lapse between the trigger and the measurement clock pulse based on the measurement amount of delay cells and the calibration amount of delay cells.

19 Claims, 3 Drawing Sheets

(51) Int. Cl.
*H03K 5/14* (2014.01)
*H03L 7/085* (2006.01)

(58) Field of Classification Search
CPC .......... H03K 2005/00019; H03K 2005/00058; H03K 5/14; H03K 2005/00026; H03L 7/085
See application file for complete search history.

(56) References Cited

U.S. PATENT DOCUMENTS 8,022,849 B2 9/2011 Zhang et al.
8,065,102 B2 * 11/2011 Kojima .............. G01R 29/0273 702/89
8,098,085 B2 1/2012 Wang et al.
8,138,843 B2 3/2012 Straayer et al.
11,496,136 B1 * 11/2022 Park ...................... H03L 7/0816
2006/0103566 A1 5/2006 Vemulapalli et al.
2006/0202729 A1 * 9/2006 Gomm ............... H03K 5/00006 327/231
2008/0068236 A1 3/2008 Sheba et al.
2008/0238652 A1 10/2008 Henzler et al.
2013/0191061 A1 * 7/2013 Wang .................... G04F 10/005 702/66
2017/0294921 A1 * 10/2017 Kris .................... H03M 1/1028
2019/0361404 A1 11/2019 Mautner et al.
2024/0183953 A1 * 6/2024 Yasuda ................... G01S 17/14
2024/0361729 A1 * 10/2024 Lu ......................... G04F 10/005

OTHER PUBLICATIONS

Jansson et al., “A CMOS time-to-digital converter with better than 10 ps single-shot precision”, IEEE Journal of Solid-State Circuits, as early as Jun. 1, 2006, pp. 1286-1296, vol. 41, Issue 6.
Extended European Search Report from Corresponding European Patent Application No. EP22183698.4, Jan. 10, 2023.
International Search Report from Corresponding PCT Application No. PCT/EP2023/068733, Nov. 7, 2023.

* cited by examiner

Fig. 1

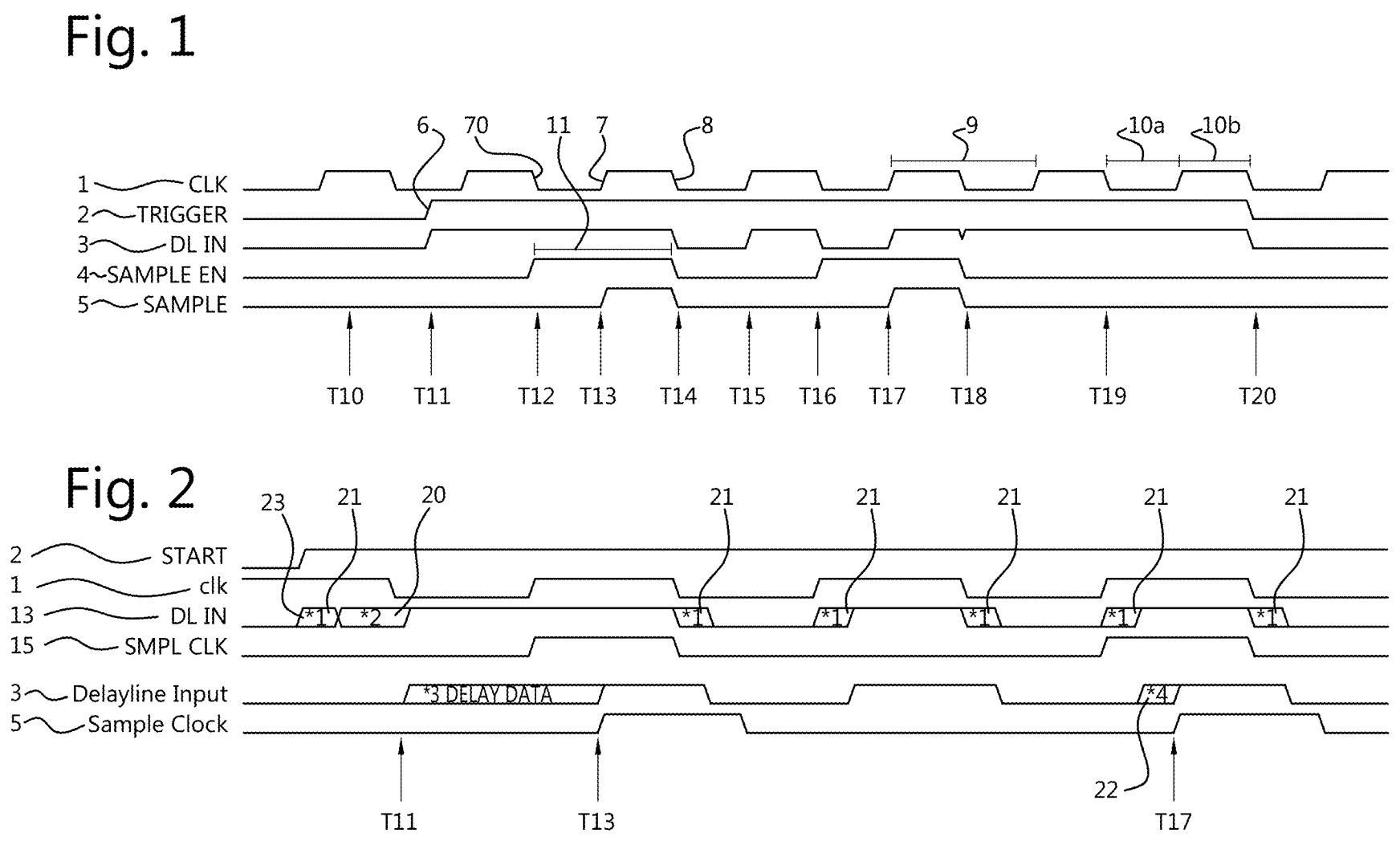

1 CLK
2 TRIGGER
3 DL IN
4 SAMPLE EN
5 SAMPLE 6 70 11 7 8 9 10a 10b

2 START
1 clk
13 DL IN
15 SMPL CLK
3 Delayline Input
5 Sample Clock 23 21 20 21 21 21 21 21 22

*1 *2 *1 *1 *1 *1 *1
*3 DELAY DATA
*4

T11 T13 T17

START DELAY LINE
31
39
StrongARM Latch Register
33
CAPTURE LATCH START
RAW CAL
51
RAW DELAY
50
RAW CAL DATA START
RAW DELAY DATA START
60
STOP DELAY LINE
40
45
StrongARM Latch Register
41
CAPTURE LATCH STOP
RAW CAL
48
RAW DELAY
47
RAW CAL DATA START
RAW DELAY DATA START
46
CLK TREE
70
CLK TREE
71
32
37
38
DL IN
DELAY LINE INJECT
Trig
Sample
Clk
51
43
44
DL IN
DELAY LINE INJECT
Trig
Sample
Clk
52
35
START
36
CLK
30
53
42
STOP
54

DELAY LINE CALIBRATION METHOD

TECHNICAL FIELD

The present invention pertains to the field of solid-state time measurement systems, in particular to time-to-digital converters (TDCs) for measuring time intervals. The present invention thereto concerns an improved delay line calibration method, which is basically a delay line drift calibration method, and a TDC device implemented with such method. The TDC device and the method of the present invention can achieve a high accuracy for the measured time intervals. A relevant CPC classification is G04F10/005.

BACKGROUND

Time to Digital Converters (TDCs) are devices which convert an analogue time difference into a digital representation. TDCs are known in the prior art. Hereby, the usage of a delay line is also known. TDCs are used to determine the time interval between two signal pulses (known as start and stop pulse). Measurement is started and stopped when the rising or falling edge of a signal pulse crosses a set threshold. This pattern is seen in many physical experiments, like time-of-flight and lifetime measurements in atomic and high energy physics, experiments that involve laser ranging and electronic research involving the testing of integrated circuits and high-speed data transfer.

There are two types of time measurements which depend on the application. There is single-shot time to digital conversion, where the start and stop event occurs only once. A single-shot TDC is able to measure the single time event and convert it. Another type of conversion is based on averaging or continuous sampling. In this case the timing events are repetitive and fluctuate slowly with a frequency smaller than the sample rate of the TDC. This type of TDC can in many cases achieve much better performance because it can apply averaging and quantisation noise filtering techniques to optimize the signal to noise ratio (SNR). However, this type of TDC can only be used in applications where the timing events of interest are occurring continuously compared to the single-shot TDC which is able to measure both continuous and single-shot timing events.

Single-shot applications can be used in high energy physics experiments, were the timing events of interest will only occur once. Additionally, in a positron emission tomography (pet scan), the time of arrival of two coincidental gamma rays 180 degrees apart can be used to increase the resolution of the captured images. Other more industrial application for single shot time of flight applications are flow metering for liquids and gasses, precise magnetostrictive positioning and level sensing. Although in these applications, a continuous TDC can also be used.

TDCs for continuous time measurement, can be used in integrated applications like all-digital phase locked loops (ADPLL) where the phase between the reference clock and the internal feedback clock is continuously monitored to achieve a stable frequency of the generated output clock. Other integrated applications are: high speed clock data recovery circuits, signal path mismatch correction in high speed memory access.

In a basic implementation, a TDC comprises a high-frequency counter that increments every clock cycle. The current contents of the counter represents the current time. When an event occurs, the counter's value is captured in an output register. The resolution of the TDC for measuring a time interval between a start and a stop signal is the period of the counter cycle. The measurement is an integer number of clock cycles, so the resolution of the measurement is a clock period. To get finer resolution, a faster clock is needed. Resolutions of about 250 ps can be typically achieved, corresponding with a 4 GHz clock. However, the present invention is concerned with achieving resolutions of 10 ps or less.

Finer measurement methods with much better resolution but typically smaller measuring ranges can be achieved using a delay line. In one method, a delay line contains a number of delay cells having a delay time. Propagating through this line, the start signal is delayed. The state of the line is sampled at the time of the arrival of the stop signal. This can be realized for example with a set of D-flip-flops (D-FF) which are arranged along the delay line, e.g. whereby between each consecutive pair of delay cells, a D-FF is linked to the delay line and is configured to be in a state reflecting whether or not the start signal has arrived in between the consecutive pair of delay cells. Hence, the start signal propagates through the delay cells and is delayed by a certain number of them until the stop signal arrives. The output of each D-FF can be sampled on the fly. The stop signal latches all D-FFs while propagating through its channel undelayed, i.e. the D-FFs are kept in the state they are in at the time of arrival of the stop signal. Now the time interval between start and stop signal is proportional to the number of D-FFs that have a state representing that the start signal had arrived there.

Regarding these fine measuring methods, there are still errors one may wish to remove or at least to consider. For instance, temperature fluctuations may change the characteristics of the delay line and/or delay cells. A possible method to compensate for these fluctuations is to delay-lock the delay cells of the delay line in a feedback loop.

A prior art TDC is disclosed in IEEE Journal of Solid-State Circuits, Volume: 41 Issue: 6 (2006), "A CMOS time-to-digital converter with better than 10 ps single-shot precision" by J.-P. Jansson, A. Mantyniemi and J. Kostamovaara. This article discloses a high-precision CMOS time-to-digital converter IC. Time interval measurement is based on a counter and two-level interpolation realized with stabilized delay lines. Reference recycling in the delay line improves the integral nonlinearity of the interpolator and enables the use of a low frequency reference clock. Multi-level interpolation reduces the number of delay elements and registers and lowers the power consumption. The load capacitor scaled parallel structure in the delay line permits very high resolution. An INL look-up table reduces the effect of the remaining nonlinearity. The digitizer measures time intervals from 0 to 204 s with 8.1 ps rms single-shot precision. The resolution of 12.2 ps from a 5-MHz external reference clock is divided by means of only 20 delay elements.

Another prior art document is: Henzler, S., Koeppe, S., Lorenz, D., Kamp, W., Kuenemund, R., & Schmitt-Landsiedel, D. (2008), "A local passive time interpolation concept for variation-tolerant high-resolution time-to-digital conversion", IEEE Journal of Solid-State Circuits, 43(7), 1666-1676. Herein, a short survey on state-of-the-art TDCs is given. A high-resolution TDC with low latency and low dead-time is proposed, where a coarse time quantization derived from a differential inverter delay-line is locally interpolated with passive voltage dividers. This high-resolution TDC is monotonic by construction which makes the concept very robust against process variations. The feasibility is demonstrated by a 90 nm demonstrator which uses a 4× interpolation and provides a time domain resolution of 4.7 ps. An integral nonlinearity of 1.2 LSB and a differential nonlinearity of 0.6 LSB are achieved. The resolution restrictions imposed by an uncertainty of the stop signal and local variations are derived theoretically.

Patent document DE102008015791B4 discloses a time delay circuit comprising: a first delay line comprising a first delay circuit and at least one second delay circuit connected downstream of the first delay circuit, a second delay line comprising a third delay circuit and at least one fourth delay circuit connected downstream of the third delay circuit, at least one first interpolation circuit which is coupled between an output of the first delay circuit and an output of the fourth delay circuit, and is configured to provide at least one first intermediate signal, which is derived from delayed signals in the first delay line and the second delay line, and a second interpolation circuit, which is coupled between an output of the second delay circuit and an output of the third delay circuit and is designed to provide at least one second intermediate signal which is derived from delayed signals in the first and second delay lines.

U.S. Pat. No. 8,138,843B2 discloses a compact, lower power gated ring oscillator time-to-digital converter that achieves first order noise shaping of quantization noise using a digital implementation. The gated ring oscillator time-to-digital converter includes a plurality of delay stages configured to enable propagation of a transitioning signal through the delay stages during an enabled state and configured to inhibit propagation of the transitioning signal through the delay stages during a disabled state. Delay stages are interconnected to allow sustained transitions to propagate through the delay stages during the enabled state and to preserve a state of the gated ring oscillator time-to-digital converter during the disabled state. The state represents a time resolution that is finer than the delay of at least one of the delay stages. A measurement module determines the number of transitions of the delay stages.

U.S. Pat. No. 8,022,849B2 discloses a phase to digital converter, all digital phase locked loop, and apparatus having an all digital phase locked loop. The phase to digital converter includes a phase to frequency converter driving a time to digital converter. The time to digital converter determines a magnitude and sign of the phase differences output by the phase to frequency converter. The time to digital converter utilizes tapped delay lines and looped feedback counters to enable measurement of small timing differences typical of a loop tracking process and large timing differences typical of a loop acquisition process. The tapped delay lines permit the measurement of fractions of a reference period and enable lower power operation of the phase to digital converter by reducing requirements on the speed of the reference clock.

The problem with prior art high-precision TDCs using delay lines, is the need for calibration because the conversion step size, defined by the delay elements propagation delay, is unknown and may vary with e.g. PVT variations and radiation degradation. A delay-locked feedback loop architecture may be employed to keep the conversion step stable. Hereby, a reference clock is used to tune the delay of the delay line to the period of the reference clock, using a feedback loop with phase detector, charge pump and loop filter. The mayor downside of this architecture is the power consumption to keep the conversion step size stable, i.e. the feedback loop requires continuous power input in order to keep the conversion step stable. In delay compensating feedback loop architectures, such as a delay-locked feedback loop architecture, the voltage domain is used to correct possible deviations of a stable delay. This poses a limit to the level which the compensation circuit is able to compensate for. The present invention aims to present a solution wherein this closed loop correction using the voltage domain is not required. Consequently, the architecture of the present invention is easily scalable to different, in particular smaller, technologies. Additionally, the present invention does not pose such compensation limit.

The present invention is also particularly related to a TDC which can be used in extreme environments, in particular aerial and space applications and in or close to nuclear installations, where radiation and temperature fluctuations can be high, and degradation may become a severe problem within a short period. Whereas prior art TDC devices can be used over a time span of years with small degradation and thereby a small need for compensation, priors TDC devices used in extreme environments may degradate much faster, e.g. within a matter of weeks or months, beyond the capability of compensating for this degradation. The present invention aims to overcome this problem.

The present invention aims to overcome the problem of continuous power consumption needed to ensure a stable conversion step to obtain precision time interval measurements with a single-shot precision (SSP) of 10 ps or lower.

The present invention also aims to overcome the problem of a dead-zone during time interval measurements. A 'dead-zone' hereby refers to a time interval after the arrival of the start signal after which a stop signal cannot be observed.

Thereto, the present invention presents an improved calibration method for a TDC device and a TDC device implemented with said calibration method.

SUMMARY OF THE INVENTION

The present invention concerns a method for measuring a time lapse between a trigger and a pulse of a clock of a time-to-digital converter (TDC) device, the method comprising the steps of:

a) providing a delay line signal to a delay line of a TDC device, said delay line signal based on said trigger (T11, T12, T13), whereby the delay line signal propagates through a chain of delay cells of the delay line, each delay cell delaying the propagation of the delay line signal;

b) subsequently, at a measurement clock pulse (T13): obtaining a measurement delay line state representing states of the delay cells, said measurement delay line state indicating a measurement amount of delay cells through which the delay line signal based on said trigger has propagated;

c) subsequently and preferably within half a clock period of said measurement clock pulse: basing the delay line signal on a clock signal and providing said delay line signal based on the clock signal to the delay line;

d) subsequently, at a calibration clock pulse (T17): obtaining a calibration delay line state representing states of the delay cells, said calibration delay line state indicating a calibration amount of delay cells through which the delay line signal based on the clock signal has propagated since the measurement clock pulse (T13) thereby allowing computing an updated conversion step of the delay line, and e) computing the time lapse between the trigger and the measurement clock pulse based on the measurement amount of delay cells and the calibration amount of delay cells.

In a preferred embodiment, the method comprises measuring a time interval between said trigger, which is a first trigger, and a second trigger by the further steps of:

f) providing a second delay line signal to a second delay line of the TDC device, said second delay line signal based on the second trigger, whereby the second delay line signal propagates through a chain of delay cells of the second delay line, each delay cell delaying the propagation of the second delay line signal;

g) subsequently, at a second measurement clock pulse: obtaining a second measurement delay line state representing states of the delay cells of the second delay line, said second measurement delay line state indicating a second measurement amount of delay cells through which the second delay line signal based on the second trigger has propagated;

h) subsequently and preferably within half a clock period of said second measurement clock pulse: basing the second delay line signal on the clock signal and providing said second delay line signal based on the clock signal to the second delay line;

i) subsequently, at a second calibration clock pulse: obtaining a second calibration delay line state representing states of the delay cells of the second delay line, said second calibration delay line state indicating a second calibration amount of delay cells through which the second delay line signal based on the clock signal has propagated since the second measurement clock pulse thereby allowing computing an updated conversion step for the second delay line, and j) computing a second time lapse between the second trigger and the second measurement clock pulse based on the second measurement amount of delay cells and the second calibration amount of delay cells, and k) computing the time interval between the first trigger and the second trigger based on the time lapse computed in step e) and the second time lapse computed in stap j) and optionally based on intermediate clock pulses between the measurement clock pulse in step b) and the second measurement clock pulse in step h).

The method described above using two delay lines is particularly preferred if the second trigger may arrive quickly after the first trigger. In such cases, it is preferred to have two delay lines in order to eliminate any problems occurring because of a dead-zone in the delay line. In cases where one knows that the second trigger will arrive later than the dead zone of the delay line, the present invention also allows measurement of a time interval using a single delay line. Hence, in another preferred embodiment the method comprises measuring a time interval between said trigger, which is a first trigger, and a second trigger by the further steps of:

l) providing a second delay line signal to said delay line of the TDC device, said second delay line signal based on the second trigger, whereby the second delay line signal propagates through said chain of delay cells of the delay line, each delay cell delaying the propagation of the second delay line signal;

m) subsequently, at a second measurement clock pulse: obtaining a second measurement delay line state representing states of the delay cells of the delay line, said second measurement delay line state indicating a second measurement amount of delay cells through which the second delay line signal based on the second trigger has propagated;

n) subsequently and preferably within half a clock period of said second measurement clock pulse: basing the second delay line signal on the clock signal and providing said second delay line signal based on the clock signal to the delay line;

o) subsequently, at a second calibration clock pulse: obtaining a second calibration delay line state representing states of the delay cells of the delay line, said second calibration delay line state indicating a second calibration amount of delay cells through which the second delay line signal based on the clock signal has propagated since the second measurement clock pulse thereby allowing computing an updated conversion step for the delay line, and p) computing a second time lapse between the second trigger and the second measurement clock pulse based on the second measurement amount of delay cells and the second calibration amount of delay cells, and q) computing the time interval between the first trigger and the second trigger based on the time lapse computed in step e) and the second time lapse computed in stap p) and optionally based on intermediate clock pulses between the measurement clock pulse in step b) and the second measurement clock pulse in step n).

The present invention also concerns a time-to-digital (TDC) device for measuring a time lapse between a trigger and a pulse of a clock, comprising a clock, a delay line, a delay line inject block, a register and a processing unit, whereby the delay line inject block comprises a trigger input for receiving a trigger, and a clock input operably connected to the clock for receiving clock pulses;

the delay line inject block comprises a delay line output operably connected to the delay line for providing a delay line signal to the delay line, and a sampling output operably connected to the register for indicating when a delay line state is to be obtained;

the delay line comprises a chain of delay cells, each delay cell configured for delaying the propagation of a delay line signal through said chain;

the register is operably connected to each of the delay cells of the delay line, the register being configured to obtain a delay line state upon receiving a sampling signal from the delay line inject block, the delay line state representing the state of each delay cell, and the register further being configured to provide the processing unit with the delay line state, and the processing unit is configured to receive a delay line state from the register, wherein the delay line inject block is configured to:

upon receiving a trigger at the trigger input: provide a delay line signal to the delay line via the delay line output, said delay line signal based on said trigger received at the trigger input, subsequently, at a measurement clock pulse received at the clock input: provide a sampling signal at the sampling output, whereupon the register is configured to obtain a measurement delay line state and provide the measurement delay line state to the processing unit, subsequently and preferably within half a clock period of said measurement clock pulse: base the delay line signal on a clock signal received at the clock input, and provide said delay line signal based on the clock signal to the delay line, subsequently, at a calibration clock pulse: provide a sampling signal at the sampling output, whereupon the register is configured to obtain a calibration delay line state and provide the calibration delay line state to the processing unit, and whereby the processing unit is configured to compute the time lapse between the trigger and the measurement clock pulse based on the measurement delay line state and the calibration delay line state.

In a preferred embodiment the trigger is a first trigger and the measurement clock pulse is a first measurement clock pulse, and the TDC device comprises a second delay line and a second register, wherein

- the delay line inject block comprises a second trigger input for receiving a second trigger;
- the delay line inject block comprises a second delay line output operably connected to the second delay line for providing a second delay line signal to the second delay line, and a second sampling output operably connected to the second register for indicating when a second-delay-line state is to be obtained for the second delay line;
- the second delay line comprises a second chain of delay cells, each delay cell configured for delaying the propagation of a second delay line signal through said second chain;
- the second register is operably connected to each of the delay cells of the second delay line, the second register being configured to obtain a second-delay-line state upon receiving a sampling signal from the delay line inject block, the second-delay-line state representing the state of each delay cell of the second delay line, and the second register further being configured to provide the processing unit with the second-delay-line state, and
- the processing unit is configured to receive a second-delay-line state from the second register, wherein the delay line inject block is configured to:

- upon receiving a second trigger at the second trigger input: provide a second delay line signal to the second delay line via the second delay line output, said second delay line signal based on said second trigger received at the second trigger input,
- subsequently, at a second measurement clock pulse: provide a sampling signal at the second sampling output, whereupon the second register is configured to obtain a second measurement delay line state and provide the second measurement delay line state to the processing unit,
- subsequently and preferably within half a clock period of said second measurement clock pulse: base the second delay line signal on the clock signal received at the clock input, and provide said second delay line signal based on the clock signal to the second delay line,
- subsequently, at a second calibration clock pulse: provide a sampling signal at the second sampling output, whereupon the second register is configured to obtain a second calibration delay line state and provide the second calibration delay line state to the processing unit, and whereby the processing unit is configured to compute the time lapse between the second trigger and the second measurement clock pulse based on the second measurement delay line state and the second calibration delay line state, and whereby the processing unit is configured to compute a time interval between the first trigger and the second trigger based on the time lapse between the first trigger and the first measurement clock pulse and on the time lapse between the second trigger and the second measurement clock pulse and optionally based on intermediate clock pulses between the first measurement clock pulse and the second measurement clock pulse.

The TDC device described above using two delay lines is particularly preferred if the second trigger may arrive quickly after the first trigger. In such cases, it is preferred to have two delay lines in order to eliminate any problems occurring because of a dead-zone in the delay line. In cases where one knows that the second trigger will arrive later than the dead zone of the delay line, the present invention also allows measurement of a time interval using a single delay line. Hence, in another preferred embodiment of the TDC device, the trigger is a first trigger and the measurement clock pulse is a first measurement clock pulse, whereby

- each delay cell is configured for delaying the propagation of a second delay line signal through said chain;
- the register is configured to obtain a second-delay-line state upon receiving a sampling signal from the delay line inject block, the second-delay-line state representing the state of each delay cell of the delay line, and the register further being configured to provide the processing unit with the second-delay-line state, and
- the processing unit is configured to receive a second-delay-line state from the register, wherein the delay line inject block is configured to:

- upon receiving a second trigger at the input: provide a second delay line signal to the delay line via the delay line output, said second delay line signal based on said second trigger received,
- subsequently, at a second measurement clock pulse: provide a sampling signal at the sampling output, whereupon the register is configured to obtain a second measurement delay line state and provide the second measurement delay line state to the processing unit,
- subsequently and preferably within half a clock period of said second measurement clock pulse: base the second delay line signal on the clock signal received at the clock input, and provide said second delay line signal based on the clock signal to the delay line,
- subsequently, at a second calibration clock pulse: provide a sampling signal at the sampling output, whereupon the register is configured to obtain a second calibration delay line state and provide the second calibration delay line state to the processing unit, and whereby the processing unit is configured to compute the time lapse between the second trigger and the second measurement clock pulse based on the second measurement delay line state and the second calibration delay line state, and whereby the processing unit is configured to compute a time interval between the first trigger and the second trigger based on the time lapse between the first trigger and the first measurement clock pulse and on the time lapse between the second trigger and the second measurement clock pulse and optionally based on intermediate clock pulses between the first measurement clock pulse and the second measurement clock pulse.

In a preferred embodiment, the TDC comprises a power stabiliser for stabilizing the power provided to the delay cells of the delay line. Preferably said power stabilizer is a tuneable stabilizer. Preferably the power stabilizer is a low dropout regulator (LDO). In a particularly preferred embodiment, the delay line is powered by a low dropout regulator (LDO) which is digitally trimmed to output an adaptable supply voltage to the delay line cells, preferably the LDO being configured to stabilize the conversion step, e.g. by a feedback-based controller whereby a change in conversion step triggers an adaptation in the supply voltage to keep the conversion step stable, and preferably fixed. The supply voltage directly affects the signal delay for each of the delay cells.

An additional calibration, by changing LDO trim settings in a feedback loop, can be performed to ensure a stable conversion step across wide temperature variation and other forms of degradation. Although the calibration of the present invention allows to operate the TDC without a need for actively regulating the voltage on which the delay line and the delay cells operate in order to fix the delay cell time, a tuneable LDO allows to improve on the performance of the TDC of the present invention: the power can be stabilized and can be tuned in response to long-time degradation. With respect to the latter, it is for instance possible that after a long time, the degradation is such that the number of delay cells in the delay is not enough to measure over the complete period. In such cases, the tunability of the LDO allows to compensate. Hence, in an embodiment, the LDO is configured to provide the delay line with a power which depends on the measured calibration amount of delay cells and/or on the computed conversion step size, preferably said measured calibration amount of delay cells and/or on the computed conversion step size being averaged over a number of n measurements, whereby n preferably is at least 100, More preferably at least 1000. Hence, the tuning loop will determine, based on multiple calibration values, whether to increase or decrease the LDO trim setting to achieve a set calibration value which corresponds to a desired conversion resolution of the application. Note that such compensation can also be performed for other reasons than long-time degradation.

Preferably, each delay line is powered by an LDO, i.e. the first delay being powered by a first LDO and the second delay line being powered by an LDO, etc., whereby each of the LDOs is separately digitally trimmed to output an adaptable supply voltage to the delay line cells of the delay line powered by the LDO.

OVERVIEW OF THE FIGURES

FIGS. 1 and 2 illustrate a method according to the present invention in view of the input and output signals.

DETAILED DISCUSSION OF THE INVENTION

Figure 3:
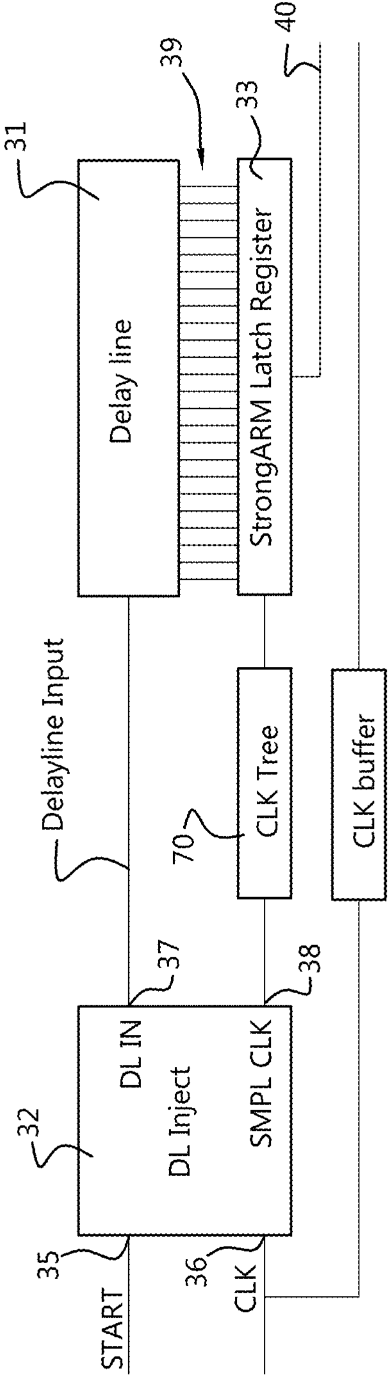
FIG. 3 illustrates an embodiment of the device according to the present invention with one delay line.
Figure 4:
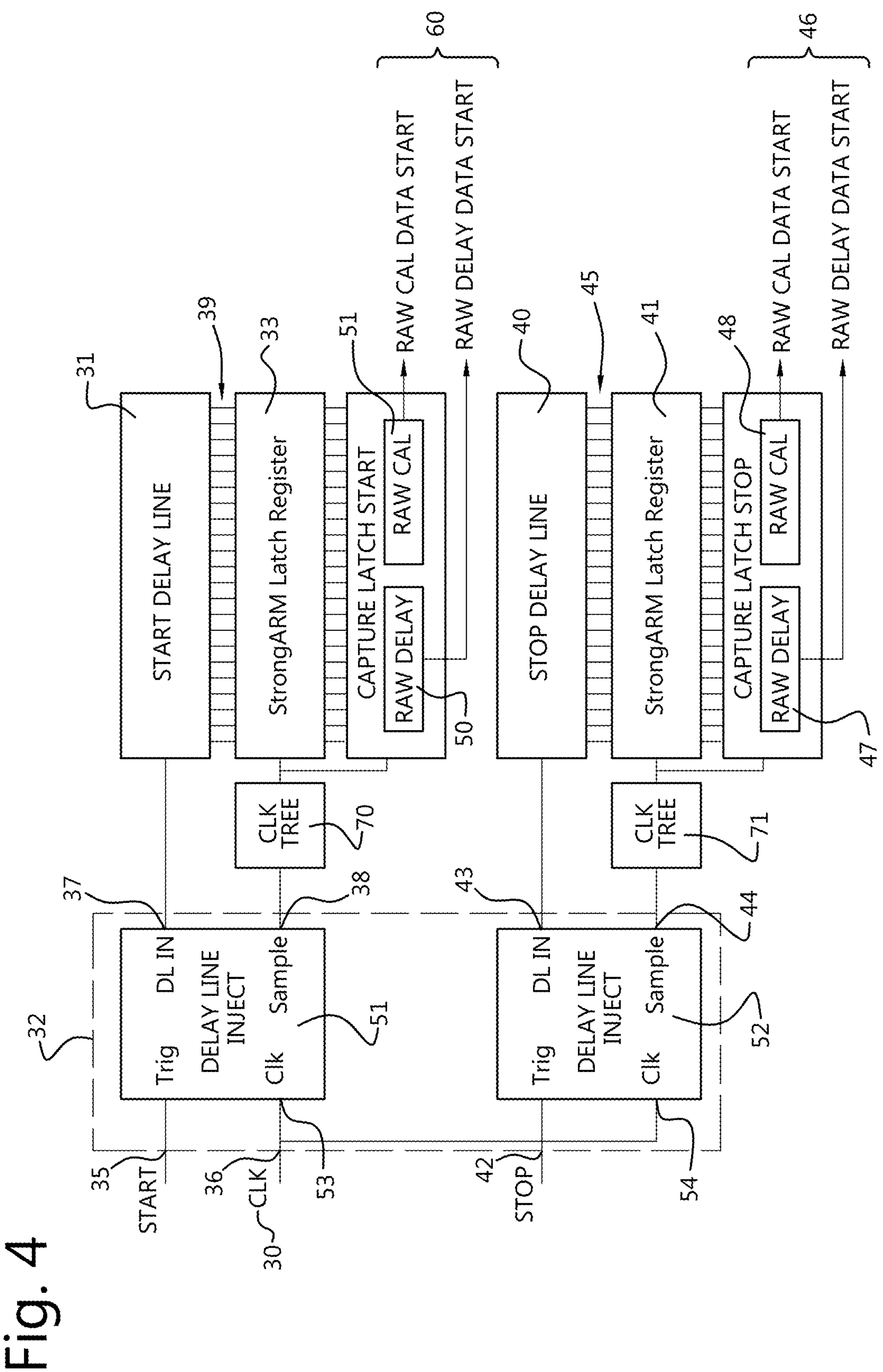
FIG. 4 illustrates an embodiment of the device according to the present invention with at least two delay lines.

As discussed previously, the present invention concerns a method for measuring a time lapse between a trigger and a pulse of a clock of a time-to-digital converter (TDC) device, and a TDC device for performing such method.

We will now discuss the present invention with reference to the figures.

The method comprising a first step a) of providing a delay line signal (3) to a delay line of a TDC device, said delay line signal based (T11, T12, T13) on said trigger (6), whereby the delay line signal propagates through a chain of delay cells of the delay line, each delay cell delaying the propagation of the delay line signal.

A delay line comprises a linear chain of delay cells, each delay cell in the chain being configured to pass a signal received at an input of the delay cell to the following delay cell in the delay line after a delay time. Preferably the delay time is essentially the same for each delay cell of the delay line. The conversion step size is basically the average delay time per delay cell in a delay line. As a result, a signal received at the input of the first delay cell of the chain may propagate through the delay line at an average speed of 1 delay cell per conversion step size.

The trigger preferably comprises a signal change, such as a rising edge or a falling edge of a digital electrical signal, preferably a rising edge of a digital electrical signal. The present invention allows measuring the instant at which a trigger arrives to an accuracy which is of the order of the delay time of a delay cell. For instance, a TDC in accordance with the present invention may operate with a clock having a period of 800 ps. Hence, by only using the clock for measurement, one can typically obtain a resolution of about half the period, i.e. up to 400 ps. In order to increase the resolution of measuring the time at which a trigger arrives at the TDC, a delay line with a chain of delay cells is used. The trigger is allowed to change the state of the delay cells of the line, but in a linear way, and each state change takes a certain time, i.e. a delay time, before the state of the next delay cell in the chain can be altered. What thus can be measured is the amount of delay cells in the chain whose states have been changed by the trigger until the next clock occurrence of a specific clock signal. This specific occurrence in the clock signal is a clock pulse, which occurs once every period of the clock signal, and which can preferably be the rising edge or the falling edge of the clock signal, most preferably the rising edge. This applies to the first and second measurement clock pulse and to the first and second calibration clock pulse. In order to ensure that a trigger which arrives around the same instant of a clock pulse can also be measured, it is usually preferred that the delay line inject block waits at least half a period of the clock before measuring the state of the delay line.

As indicated above, the exact delay time of each delay cell can fluctuate due to variations in operating conditions such as temperature, degradation, voltage and current fluctuations, etc. The present invention allows calibration of the extracted time lapse basically by measuring how many delay cells change the state during 1 period of the clock. For instance, if 100 delay cells change the state during 1 period, it is clear that the delay time of 1 delay cell is, at least on average, 1/100 of the clock period. Hence, for an 800 ps clock period, the measurement resolution will be about 8 ps. However, at a different moment in time, under other conditions of temperature, degradation, power fluctuation, etc., it is possible that 105 delay cells change their state during propagation of a clock signal through the chain during 1 clock period. In this case, the measurement resolution of the arrival of the trigger is 1/105 of the clock period, e.g. about 7.62 ps for an 800 ps clock period. Hence, the resolution of the measurement may change between measurements. However, note that this change in resolution is typically confined to at most 20%, preferably at most 10%, still more preferably at most 5%. Preferably, the number of delay cells in the delay line is at least 5%, more preferably at least 10%, and yet more preferably at least 20% more than the ratio between the clock period and a prospected delay time of the delay cells in the delay line. E.g. if the clock period is 800 ps, and the prospected delay time of a delay cell is 8 ps, then the number of delay cells is at least 5% more than the ratio of 800 ps and 8 ps, i.e. at least 105 delay cells, more preferably at least 10% more than the ratio of 800 ps and 8 ps, i.e. at least 110 delay cells, and yet more preferably at least 20% more than said ration, i.e. at least 120 delay cells. Note that for the present invention, although the resolution may change slightly, the precision and accuracy remain largely the same due to the calibration procedure of the present invention.

The method further comprises the step b): subsequently to step a), at a measurement clock pulse (7, at instant T13): obtaining a measurement delay line state representing states of the delay cells, said measurement delay line state indicating a measurement amount of delay cells through which the delay line signal based on said trigger has propagated.

As indicated before, what can be measured is the amount of delay cells in the chain whose states have been changed by the trigger until the next clock occurrence of a specific clock signal. This specific occurrence in the clock signal is a clock pulse, which occurs once every period (9) of the clock signal, and which can preferably be the rising edge or the falling edge of the clock signal, most preferably the rising edge. Hence, the measurement clock pulse preferably is a rising edge or a falling edge in a clock signal, preferably a rising edge.

In order to ensure that a trigger which arrives around the same instant of a clock pulse can also be measured, it is preferred that the delay line inject block waits at least half a period of the clock before measuring the state of the delay line. Hence, the measurement clock pulse preferably is a rising edge (7) or a falling edge (8) of the clock signal (1) occurring at least half a period after arrival of the trigger, more preferably the measurement clock pulse is the first clock pulse occurring at least half a period (10*a*, 10*b*) after arrival of the trigger (6). In such embodiment, the number of delay cells in the delay line is at least 50% more than the ratio between the clock period and a prospected delay time of the delay cells in the delay line. E.g. if the clock period is 800 ps, and the prospected delay time of a delay cell is 8 ps, then the number of delay cells is at least 50% more than the ratio of 800 ps and 8 ps, i.e. at least 150 delay cells. In combination with the at least 5%, more preferably at least 10%, and yet more preferably at least 20% more delay cells needed to compensate for variations in delay time of the delay cells, which was discussed above, the number of delay cells in the delay line is at least 57.5%, more preferably at least 65%, and yet more preferably at least 80% more than the ratio between the clock period and a prospected delay time of the delay cells in the delay line. E.g. if the clock period is 800 ps, and the prospected delay time of a delay cell is 8 ps, then the number of delay cells is at least 57.5% more than the ratio of 800 ps and 8 ps, i.e. at least 158 delay cells, more preferably at least 65% more than the ratio of 800 ps and 8 ps, i.e. at least 165 delay cells, and yet more preferably at least 85% more than said ratio, i.e. at least 185 delay cells.

The above waiting time of at least half a period can preferably be implemented by providing a sampling-enabling signal (4), preferably to the register of the device, which is configured to indicate during which clock period (11) a state of the delay line is allowed to be obtained. Hence, preferably the measurement clock pulse is defined by the clock pulse occurring during a single clock period, which single clock period is indicated by a sampling-enabling signal which is set to high after arrival of the trigger, preferably the sampling-enabling signal is set to high when a falling edge of the clock is detected after a trigger was received. The sampling enabling signal hereby signals to e.g. the register of the TDC device that the states of the delay cells may be read out if a clock pulse occurs. Note that the clock pulse is an identifiable feature which occurs once every clock period, preferably the clock pulse is the rising edge of the clock signal, which can preferably be taken as the instant at which the clock signal switches from a low value to a high value. The exact instant of the switch from a low value to a high value and from a high value to a low value can be dependent on the hardware implementation. For instance, the switch from a low value to a high value may occur when the signal reaches 80% of the high value.

Because the arrival of a trigger signal can be unpredictable and uncorrelated to the clock pulse, it is possible they will arrive at the same time. Therefore, the delay line inject block can be required to detect e.g. a falling edge on the clock after it has received a trigger input. This allows at least half a clock period to enable the sample pulse derived from the clock. This behaviour can be seen as the TDC waiting at least half a clock period before measuring the state of the delay line. When a clock pulse (e.g. a rising edge) occurs within half a clock period after the trigger pulse, there was no falling edge detected after the trigger pulse. Therefore, the first clock pulse will not be used to generate a sample pulse but rather the second clock pulse, i.e. when a falling edge of the clock pulse was detected after the trigger pulse. It is therefore correct to say that in the cases where the clock pulse (e.g. rising edge) occurs within half a clock period after the trigger pulse, the delay line signal will be propagating the delay line for at least one clock period and max for one and a half clock period. Therefore, the delay line preferably is configured to propagate 1.5 times the clock period.

Alternatively, or additionally, to ensure that a trigger which arrives around the same instant of a clock pulse can also be measured, a configurable delay could be put on the delay line signal (3). Hence, in an embodiment of the present invention, the delay line signal based on the trigger may comprise a first configurable delay (20) which delays the trigger, preferably by changing the phase of an arriving trigger signal inside the delay line inject block, thereby allowing a reduction of the required dynamic range of the delay line, i.e. the amount of delay cells in the delay line which are needed to perform the measurements may be reduced. When first e.g. a falling edge needs to be detected before a sample pulse can be generated from the clock pulse, the trigger signal was already, at least, propagating for half a clock period in the delay line. Therefore, reduction of the 'useless' signal propagation in the delay line of half a clock period, is preferred as much as possible, for which we can use the configurable delay. In this embodiment, the first configurable delay is at most half a clock period to reduce the 'useless' signal but to ensure that the signal is not missed. Note that the first configurable delay (2) delays the delay line signal only when it is based on the trigger.

Alternatively, or additionally, the delay line signal (3) may comprise a second configurable delay (21) which incorporates a delay in the delay line signal when based on the trigger or the clock signal. This configurable delay allows to compensate for a physical path delay mismatch between the delay line signal path (37) and the sample clock signal path (38). For example: When a signal is coming out of the delay line inject output (37) and (38) at the same time, it is best that they also arrive to the delay line and the strongARM latches at the same time, although in practice, the sample pulse (38) may arrive a little bit later than the delay line signal. However, if one wants to better compensate for the mismatch or if one wants to better control the timing between arrival of the trigger and arrival of the sample clock, e.g. to ensure that the sample clock arrives later than the trigger, said second configurable delay may be incorporated.

The method of the present invention also comprises step c): subsequently and preferably within half a clock period of said measurement clock pulse: basing the delay line signal on a clock signal and providing said delay line signal based on the clock signal to the delay line.

The idea is to switch the delay line input signal from a trigger-based signal to a clock-based signal allowing to perform the calibration of the delay line and in particular of the conversion step thereof. Hence, the signal received by the delay line is in a first instance based on the trigger and the first delay line state (obtained in step b) is indicative of the arrival of the trigger, while the signal received by the delay line is in a second instance based on the clock and the second delay line state (obtained in the next step d) will be indicative of the arrival of subsequent clock pulses. The switch from a trigger-based signal to a clock-based signal is preferably performed within half a clock period from the measurement clock pulse. This is particularly preferred if the clock pulse is a rising edge in the clock signal, such that the delay line signal which is in a high state due to the trigger remains in the high state when being switched from trigger-based to clock-based. Switching the delay line signal from trigger based to clock based at a time when both have the same voltage level is preferred, in particular for reducing power consumption.

As indicated above, the delay line signal coming from the delay line inject block will switch from being based on the trigger signal to being based on the clock signal. Performing this switch and calibration state measurement at any time after the trigger is possible, but the earlier the switch is made after the trigger state measurement, the better, as an earlier switching will result in a better quality of the calibration.

The method of the present invention comprises a step d): subsequently, at a calibration clock pulse (T17): obtaining a calibration delay line state representing states of the delay cells, said calibration delay line state indicating a calibration amount of delay cells through which the delay line signal based on the clock signal has propagated since the measurement clock pulse (T13) thereby allowing computing an updated conversion step of the delay line.

The calibration clock pulse hereby is a clock pulse occurring after the measurement clock pulse, and preferably is at least the second clock pulse after the measurement clock pulse. Taking at least the second clock pulse after the measurement clock pulse in contrast to the first clock pulse after the measurement clock pulse, ensures that at least a full period of the clock signal has propagated through the delay line. Preferably hereby, the calibration clock pulse hereby is the second clock pulse after the measurement clock pulse, and e.g. not the third or fourth, in order to obtain the conversion step is fast as possible after the arrival of the trigger.

The present method also comprises the step e): computing the time lapse between the trigger and the measurement clock pulse based on the measurement amount of delay cells and the calibration amount of delay cells.

Preferably, the time lapse between the trigger and the measurement clock pulse is essentially the measurement amount of delay cells divided by the calibration amount of delay cells and multiplied by the clock period.

In order to measure a time interval between a start and a stop signal, the above method can be performed twice, once using the start signal as a trigger and another time using the stop signal as a second trigger. Steps f) to j) thus are the same as steps a) to e) but applied to a second trigger which can be a stop signal. In an embodiment, the steps f) to j) may be performed more than once, e.g. two, three, four times or more, to compute time intervals between consecutive arriving triggers.

In an embodiment for measuring a time interval between a start signal and a stop signal, the method also comprises step k): computing the time interval between the first trigger and the second trigger based on the time lapse computed in step e) and the second time lapse computed in step j) and optionally based on intermediate clock pulses between the measurement clock pulse in step b) and the second measurement clock pulse in step h). Since steps a) to e) allow to obtain the time lapse between a first trigger and a first measurement clock pulse and steps f) to j) allow to obtain the time lapse between a second trigger and a second measurement clock pulse, the time interval between the first trigger and the second trigger depends on the difference in time lapses obtained in steps e) and j) and, optionally in the case the triggers do not arrive within the same clock period, also on the number of intermediate clock pulses between the two measurement clock pulses. Preferably the time interval (TI) can be computed as the difference between the time lapse from step e) (TLe) and the time lapse from step g) (TLg) plus the number of intermediate clock pulses (NCP) multiplied by the clock period (TC):

$$TI = TLe - TLg + (NCP * TC)$$

The method of the present invention can be implemented on a TDC device in accordance with the present invention. The TDC device comprises a clock (30), a delay line (31), a delay line inject block (32), a register (33) and a processing unit, whereby

- the delay line inject block (32) comprises a trigger input (35) for receiving a trigger, and a clock input (36) operably connected to the clock (30) for receiving clock pulses;
- the delay line inject block (32) comprises a delay line output (37) operably connected to the delay line (31) for providing a delay line signal to the delay line, and a sampling output (38) operably connected to the register for indicating when a delay line state is to be obtained;

the delay line (31) comprises a chain of delay cells, each delay cell configured for delaying the propagation of a delay line signal through said chain;

the register (33) is operably connected to each of the delay cells (39) of the delay line, the register being configured to obtain a delay line state upon receiving a sampling signal from the delay line inject block, the delay line state representing the state of each delay cell, and the register further being configured to provide (60) the processing unit with the delay line state, and the processing unit is configured to receive a delay line state from the register, wherein the delay line inject block (32) is configured to:

upon receiving a trigger at the trigger input: provide a delay line signal to the delay line via the delay line output (37), said delay line signal based on said trigger received at the trigger input, subsequently, at a measurement clock pulse received at the clock input: provide a sampling signal at the sampling output (38), whereupon the register (33) is configured to obtain a measurement delay line state and provide the measurement delay line state (50) to the processing unit, subsequently and preferably within half a clock period of said measurement clock pulse: base the delay line signal on a clock signal received at the clock input (36), and provide said delay line signal based on the clock signal to the delay line, subsequently, at a calibration clock pulse: provide a sampling signal at the sampling output (38), whereupon the register (33) is configured to obtain a calibration delay line state and provide the calibration delay line state (51) to the processing unit, and whereby the processing unit is configured to compute the time lapse between the trigger and the measurement clock pulse based on the measurement delay line state (50) and the calibration delay line state (51).

In order to measure a time interval between a start signal and a stop signal without a dead zone, an embodiment of the present invention with two delay lines is preferred. Note that the present invention requires a calibration of the delay line conversion step by measuring the clock period in terms of delay cells in the delay line just after the time lapse has been measured. This implies a dead zone in that delay line whereby a second trigger arriving at that delay line may not be easily measured. For this reason, a second delay line for measuring the time lapse between the second trigger and a second measurement clock pulse is preferred. Hence, in a preferred embodiment the trigger is a first trigger which can be received at the first trigger input (35) and the measurement clock pulse is a first measurement clock pulse, and the TDC device comprises a second delay line (40) and a second register (41), wherein, the delay line inject block (32) comprises a second trigger input (42) for receiving a second trigger;

the delay line inject block (32) comprises a second delay line output (43) operably connected to the second delay line (40) for providing a second delay line signal to the second delay line, and a second sampling output (44) operably connected to the second register (41) for indicating when a second-delay-line state is to be obtained for the second delay line;

the second delay line (40) comprises a second chain of delay cells, each delay cell configured for delaying the propagation of a second delay line signal through said second chain;

the second register (41) is operably connected (45) to each of the delay cells of the second delay line, the second register (41) being configured to obtain a second-delay-line state upon receiving a sampling signal from the delay line inject block via the second sampling output (44), the second-delay-line state representing the state of each delay cell of the second delay line (40), and the second register (41) further being configured to provide (46) the processing unit with the second-delay-line state, and the processing unit is configured to receive a second-delay-line state from the second register (41), wherein the delay line inject block (32) is configured to:

upon receiving a second trigger at the second trigger input (42): provide a second delay line signal to the second delay line (40) via the second delay line output (43), said second delay line signal based on said second trigger received at the second trigger input, subsequently, at a second measurement clock pulse: provide a sampling signal at the second sampling output (44), whereupon the second register (41) is configured to obtain a second measurement delay line state and provide the second measurement delay line state (47) to the processing unit, subsequently and preferably within half a clock period of said second measurement clock pulse: base the second delay line signal on the clock signal received at the clock input (36), and provide said second delay line signal based on the clock signal to the second delay line (40), subsequently, at a second calibration clock pulse: provide a sampling signal at the second sampling output (44), whereupon the second register (41) is configured to obtain a second calibration delay line state and provide the second calibration delay line state (48) to the processing unit, and whereby the processing unit is configured to compute the time lapse between the second trigger and the second measurement clock pulse based on the second measurement delay line state (47) and the second calibration delay line state (48), and whereby the processing unit is configured to compute a time interval between the first trigger and the second trigger based on the time lapse between the first trigger and the first measurement clock pulse and on the time lapse between the second trigger and the second measurement clock pulse and optionally based on intermediate clock pulses between the first measurement clock pulse and the second measurement clock pulse.

In an embodiment, the delay line (DL) inject block comprises a first DL inject subblock (51) and a second DL inject subblock (52), whereby the first DL inject block comprises the first trigger input (35), a first DL clock input (53) connected to the clock input (36), the first delay line output (37) and the first sampling output (38, and whereby the second DL inject subblock (52) comprises the second trigger input (42), a second DL clock input (54) connected to the clock input (36), the second delay line output (43) and the second sampling output (44). Splitting the delay line inject block into subblocks, each of which drives a delay line and according register allows easier implementation and easier scaling if more than two delay lines are used, for instance to measure time lapses and intervals with more than two triggers.

In embodiments, the first register and/or the second register is a strongARM latch register.

In an embodiment, a clock tree (70) is used to equally distribute the sampling signal to the register (33). Preferably a second clock tree (71) is used to equally distribute the second sampling signal to the second register (41). This allows the state of the delay line to be measured instantaneously, i.e. the state of each delay cell of the delay is being measured at the same instant.

Example 1

We refer to FIG. 1, which illustrates the signals relevant for the operation of a delay line in accordance with the present invention:

- a clock signal (1), which is a signal that originates from the high frequency clock, e.g. a clock at a stable clock frequency of between 0.1 GHz and 10 GHz, thus having a stable period ranging from 10 ns down to 100 ps;
- a trigger signal (2) which can be a first signal or a second signal in accordance with the present invention. The trigger signal hereby basically provides an input related to the start or the end of a time interval which needs to be measured;
- a delay line (DL) input signal (3), which is the signal provided as input to the first delay cell of the delay line and which propagates through the delay line;
- a sampling-enabling signal (4), which is a signal that basically indicates during which interval a DL state sampling is allowed to be obtained;
- a sampling signal (5), which is a signal that indicates at which instant a sampling of the DL state is to be obtained.

In order to illustrate the present invention, eleven instants are indicated on FIG. 1, numbered from (T10) to (T20), at which instants we can discuss the possible state of the delays cells of the delay line.

For instance, and for illustration purposes, we discuss the present invention in respect of a delay line having 15 delay cells. We will also take the frequency of the high frequency clock to be 1 GHz, and thus a period of 1000 ps. Furthermore, in the present example, the ideal delay time of each delay cell is 100 ps. The states at the different instants T10 to T20 are given in table 1.

TABLE 1 exemplary states of the delay line with 15 delay cells at instants T10 to T20

| T | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| T10 | 0 | 0 | 0 | 0 | 0 | 0 | 0 | 0 | 0 | 0 | 0 | 0 | 0 | 0 | 0 |
| T11 | 1 | 0 | 0 | 0 | 0 | 0 | 0 | 0 | 0 | 0 | 0 | 0 | 0 | 0 | 0 |
| T12 | 1 | 1 | 1 | 1 | 1 | 1 | 1 | 0 | 0 | 0 | 0 | 0 | 0 | 0 | 0 |
| T13 | 1 | 1 | 1 | 1 | 1 | 1 | 1 | 1 | 1 | 1 | 1 | 1 | 0 | 0 | 0 |
| T14 | 0 | 1 | 1 | 1 | 1 | 1 | 1 | 1 | 1 | 1 | 1 | 1 | 1 | 1 | 1 |
| T15 | 1 | 0 | 0 | 0 | 0 | 0 | 1 | 1 | 1 | 1 | 1 | 1 | 1 | 1 | 1 |
| T16 | 0 | 1 | 1 | 1 | 1 | 1 | 0 | 0 | 0 | 0 | 0 | 1 | 1 | 1 | 1 |
| T17 | 1 | 0 | 0 | 0 | 0 | 0 | 1 | 1 | 1 | 1 | 1 | 0 | 0 | 0 | 0 |
| T18 | 1 | 1 | 1 | 1 | 1 | 1 | 0 | 0 | 0 | 0 | 0 | 1 | 1 | 1 | 1 |
| T19 | 1 | 1 | 1 | 1 | 1 | 1 | 1 | 1 | 1 | 1 | 1 | 1 | 1 | 1 | 1 |
| T20 | 0 | 1 | 1 | 1 | 1 | 1 | 1 | 1 | 1 | 1 | 1 | 1 | 1 | 1 | 1 |

At T10, the system is awaiting the arrival of a trigger, only the clock signal is active.

At T11, a trigger (6) arrives. A delay line input signal (3) based on the trigger can be sent to the delay line.

At T12, triggered by the first falling edge of the clock signal (70), the sampling enabling signal (4) is set to high, indicating that on the next clock pulse the state of the delay line can be measured.

At T13, the measurement clock pulse occurs, and the delay line state is obtained, which can be sent to the processor.

After T13, and between T13 and T14, the delay line input signal is switched from being trigger-based to clock-based. The delay line input signal is thus set to low (T14) triggered by the next falling edge of the clock signal (8). The sampling enabling signal is also set too low for one clock period (T14 to T16).

At T16, the sampling enabling signal is set to high again, and on the next clock pulse (T17), the delay line state is obtained, which can be sent to the processor.

After T17, e.g. at the next falling edge of the clock pulse at T18, the delay line state is preferably based on the trigger and/or trigger signal (2) again to save power.

We can see from table 1 that at T13, the state indicates that the delay line input signal based on the trigger has propagated through 12 delay cells (0 to 11), and we see that at T17, the delay line input signal based on the clock signal shows a clock period to propagate through 10 delay cells (1 to 10). Hence, the trigger arrived 1200 ps prior to the measurement clock pulse from T13. The resolution of this measurement is about 100 ps.

Note that if one would use e.g. 150 delay cells, the resolution of the measurement would be about 10 ps.

Example 2

This example shows the same as example 1, but at a different time, when temperature, degradation, power fluctuations, etc. have induced a variation on the TDC's properties, affecting the delay time of the delay cells. Table 2 now shows the states of the delay cells with a different delay time.

TABLE 2 exemplary states of the delay line with 15 delay cells at instants T10 to T20, with different delay time for the delay cells

| T | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| T10 | 0 | 0 | 0 | 0 | 0 | 0 | 0 | 0 | 0 | 0 | 0 | 0 | 0 | 0 | 0 |
| T11 | 1 | 0 | 0 | 0 | 0 | 0 | 0 | 0 | 0 | 0 | 0 | 0 | 0 | 0 | 0 |
| T12 | 1 | 1 | 1 | 1 | 1 | 1 | 1 | 1 | 0 | 0 | 0 | 0 | 0 | 0 | 0 |
| T13 | 1 | 1 | 1 | 1 | 1 | 1 | 1 | 1 | 1 | 1 | 1 | 1 | 1 | 1 | 0 |
| T14 | 0 | 1 | 1 | 1 | 1 | 1 | 1 | 1 | 1 | 1 | 1 | 1 | 1 | 1 | 1 |
| T15 | 1 | 0 | 0 | 0 | 0 | 0 | 0 | 1 | 1 | 1 | 1 | 1 | 1 | 1 | 1 |
| T16 | 0 | 1 | 1 | 1 | 1 | 1 | 1 | 0 | 0 | 0 | 0 | 0 | 0 | 1 | 1 |
| T17 | 1 | 0 | 0 | 0 | 0 | 0 | 0 | 1 | 1 | 1 | 1 | 1 | 1 | 0 | 0 |
| T18 | 1 | 1 | 1 | 1 | 1 | 1 | 1 | 0 | 0 | 0 | 0 | 0 | 0 | 1 | 1 |
| T19 | 1 | 1 | 1 | 1 | 1 | 1 | 1 | 1 | 1 | 1 | 1 | 1 | 1 | 1 | 1 |
| T20 | 0 | 1 | 1 | 1 | 1 | 1 | 1 | 1 | 1 | 1 | 1 | 1 | 1 | 1 | 1 |

The state at T13 shows 14 delay cells having been propagated through by the trigger until the measurement clock pulse, and the state at T17 shows that the clock period is 12 delay cells long. Hence, the time lapse between trigger and measurement clock pulse at T13 can be computed to be 1000 ps*14/12, which is about 1167 ps, with a resolution of about 83 ps.

The invention claimed is:

1. A method for measuring a time lapse between a trigger and a pulse of a clock of a time-to-digital converter (TDC) device, the method comprising the steps of:

a) providing a delay line signal to a delay line of a TDC device, said delay line signal based on said trigger, wherein the delay line signal propagates through a chain of delay cells of the delay line, each delay cell delaying the propagation of the delay line signal;

b) subsequently, at a measurement clock pulse: obtaining a measurement delay line state representing states of the delay cells, said measurement delay line state indicating a measurement amount of delay cells through which the delay line signal based on said trigger has propagated;

c) subsequently and within half a clock period of said measurement clock pulse: basing the delay line signal on a clock signal and providing said delay line signal based on the clock signal to the delay line;

d) subsequently, at a calibration clock pulse: obtaining a calibration delay line state representing states of the delay cells, said calibration delay line state indicating a calibration amount of delay cells through which the delay line signal based on the clock signal has propagated since the measurement clock pulse thereby allowing computing an updated conversion step of the delay line, and e) computing the time lapse between the trigger and the measurement clock pulse based on the measurement amount of delay cells and the calibration amount of delay cells.

2. The method according to claim 1, for measuring a time interval between said trigger, which is a first trigger, and a second trigger by the further steps of:

f) providing a second delay line signal to a second delay line of the TDC device, said second delay line signal based on the second trigger, wherein the second delay line signal propagates through a chain of delay cells of the second delay line, each delay cell delaying the propagation of the second delay line signal;

g) subsequently, at a second measurement clock pulse: obtaining a second measurement delay line state representing states of the delay cells of the second delay line, said second measurement delay line state indicating a second measurement amount of delay cells through which the second delay line signal based on the second trigger has propagated;

h) subsequently and within half a clock period of said second measurement clock pulse: basing the second delay line signal on the clock signal and providing said second delay line signal based on the clock signal to the second delay line;

i) subsequently, at a second calibration clock pulse: obtaining a second calibration delay line state representing states of the delay cells of the second delay line, said second calibration delay line state indicating a second calibration amount of delay cells through which the second delay line signal based on the clock signal has propagated since the second measurement clock pulse thereby allowing computing an updated conversion step for the second delay line, and j) computing a second time lapse between the second trigger and the second measurement clock pulse based on the second measurement amount of delay cells and the second calibration amount of delay cells, and k) computing the time interval between the first trigger and the second trigger based on the time lapse computed in step e) and the second time lapse computed in step j) and optionally based on intermediate clock pulses between the measurement clock pulse in step b) and the second measurement clock pulse in step h).

3. The method according to claim 1, for measuring a time interval between said trigger, which is a first trigger, and a second trigger by the further steps of:

l) providing a second delay line signal to said delay line of the TDC device, said second delay line signal based on the second trigger, wherein the second delay line signal propagates through said chain of delay cells of the delay line, each delay cell delaying the propagation of the second delay line signal;

m) subsequently, at a second measurement clock pulse: obtaining a second measurement delay line state representing states of the delay cells of the delay line, said second measurement delay line state indicating a second measurement amount of delay cells through which the second delay line signal based on the second trigger has propagated;

n) subsequently and within half a clock period of said second measurement clock pulse: basing the second delay line signal on the clock signal and providing said second delay line signal based on the clock signal to the delay line;

o) subsequently, at a second calibration clock pulse: obtaining a second calibration delay line state representing states of the delay cells of the delay line, said second calibration delay line state indicating a second calibration amount of delay cells through which the second delay line signal based on the clock signal has propagated since the second measurement clock pulse thereby allowing computing an updated conversion step for the delay line, and p) computing a second time lapse between the second trigger and the second measurement clock pulse based on the second measurement amount of delay cells and the second calibration amount of delay cells, and q) computing the time interval between the first trigger and the second trigger based on the time lapse computed in step e) and the second time lapse computed in step p) and optionally based on intermediate clock pulses between the measurement clock pulse in step b) and the second measurement clock pulse in step n).

4. The method according to claim 1, wherein the trigger comprises a rising edge of a digital electrical signal.

5. The method according to claim 2, wherein the measurement clock pulse, the calibration clock pulse, the second measurement clock pulse and/or the second calibration clock pulse is the rising edge of a clock signal.

6. The method according to claim 1, wherein a configurable delay is put on the delay line signal.

7. The method according to claim 1, wherein step c is performed within half a clock period of said measurement clock pulse.

8. The method according to claim 1, wherein the delay line comprises a linear chain of delay cells, each delay cell in the chain being configured to pass a signal received at an input of the delay cell to the following delay cell in the delay line after a delay time.

9. A time-to-digital (TDC) device for measuring a time lapse between a trigger and a pulse of a clock, comprising a clock, a delay line, a delay line inject block, a register and a processing unit, wherein the delay line inject block comprises a trigger input for receiving a trigger, and a clock input operably connected to the clock for receiving clock pulses;

the delay line inject block comprises a delay line output operably connected to the delay line for providing a delay line signal to the delay line, and a sampling output operably connected to the register for indicating when a delay line state is to be obtained;

the delay line comprises a chain of delay cells, each delay cell configured for delaying the propagation of a delay line signal through said chain;

the register is operably connected to each of the delay cells of the delay line, the register being configured to obtain a delay line state upon receiving a sampling signal from the delay line inject block, the delay line state representing the state of each delay cell, and the register further being configured to provide the processing unit with the delay line state, and the processing unit is configured to receive a delay line state from the register, wherein the delay line inject block is configured to:

upon receiving a trigger at the trigger input: provide a delay line signal to the delay line via the delay line output, said delay line signal based on said trigger received at the trigger input, subsequently, at a measurement clock pulse received at the clock input: provide a sampling signal at the sampling output, whereupon the register is configured to obtain a measurement delay line state and provide the measurement delay line state to the processing unit, subsequently and within half a clock period of said measurement clock pulse: base the delay line signal on a clock signal received at the clock input, and provide said delay line signal based on the clock signal to the delay line, subsequently, at a calibration clock pulse: provide a sampling signal at the sampling output, whereupon the register is configured to obtain a calibration delay line state and provide the calibration delay line state to the processing unit, and wherein the processing unit is configured to compute the time lapse between the trigger and the measurement clock pulse based on the measurement delay line state and the calibration delay line state.

10. The time-to-digital (TDC) device according to claim 9, wherein the trigger is a first trigger and the measurement clock pulse is a first measurement clock pulse, and the TDC device comprises a second delay line and a second register, wherein the delay line inject block comprises a second trigger input for receiving a second trigger;

the delay line inject block comprises a second delay line output operably connected to the second delay line for providing a second delay line signal to the second delay line, and a second sampling output operably connected to the second register for indicating when a second-delay-line state is to be obtained for the second delay line;

the second delay line comprises a second chain of delay cells, each delay cell configured for delaying the propagation of a second delay line signal through said second chain;

the second register is operably connected to each of the delay cells of the second delay line, the second register being configured to obtain a second-delay-line state upon receiving a sampling signal from the delay line inject block, the second-delay-line state representing the state of each delay cell of the second delay line, and the second register further being configured to provide the processing unit with the second-delay-line state, and the processing unit is configured to receive a second-delay-line state from the second register, wherein the delay line inject block is configured to:

upon receiving a second trigger at the second trigger input: provide a second delay line signal to the second delay line via the second delay line output, said second delay line signal based on said second trigger received at the second trigger input, subsequently, at a second measurement clock pulse: provide a sampling signal at the second sampling output, whereupon the second register is configured to obtain a second measurement delay line state and provide the second measurement delay line state to the processing unit, subsequently and within half a clock period of said second measurement clock pulse: base the second delay line signal on the clock signal received at the clock input, and provide said second delay line signal based on the clock signal to the second delay line, subsequently, at a second calibration clock pulse: provide a sampling signal at the second sampling output, whereupon the second register is configured to obtain a second calibration delay line state and provide the second calibration delay line state to the processing unit, and wherein the processing unit is configured to compute the time lapse between the second trigger and the second measurement clock pulse based on the second measurement delay line state and the second calibration delay line state, and wherein the processing unit is configured to compute a time interval between the first trigger and the second trigger based on the time lapse between the first trigger and the first measurement clock pulse and on the time lapse between the second trigger and the second measurement clock pulse and optionally based on intermediate clock pulses between the first measurement clock pulse and the second measurement clock pulse.

11. The time-to-digital (TDC) device according to claim 9, wherein the trigger is a first trigger and the measurement clock pulse is a first measurement clock pulse, wherein each delay cell is configured for delaying the propagation of a second delay line signal through said chain;

the register is configured to obtain a second-delay-line state upon receiving a sampling signal from the delay line inject block, the second-delay-line state representing the state of each delay cell of the delay line, and the register further being configured to provide the processing unit with the second-delay-line state, and the processing unit is configured to receive a second-delay-line state from the register, wherein the delay line inject block is configured to:

upon receiving a second trigger at the trigger input: provide a second delay line signal to the delay line via the delay line output, said second delay line signal based on said second trigger received at the trigger input, subsequently, at a second measurement clock pulse: provide a sampling signal at the sampling output, whereupon the register is configured to obtain a second measurement delay line state and provide the second measurement delay line state to the processing unit, subsequently and within half a clock period of said second measurement clock pulse: base the second delay line signal on the clock signal received at the clock input, and provide said second delay line signal based on the clock signal to the delay line, subsequently, at a second calibration clock pulse: provide a sampling signal at the second sampling output, whereupon the register is configured to obtain a second calibration delay line state and provide the second calibration delay line state to the processing unit, and wherein the processing unit is configured to compute the time lapse between the second trigger and the second measurement clock pulse based on the second measurement delay line state and the second calibration delay line state, and wherein the processing unit is configured to compute a time interval between the first trigger and the second trigger based on the time lapse between the first trigger and the first measurement clock pulse and on the time lapse between the second trigger and the second measurement clock pulse and optionally based on intermediate clock pulses between the first measurement clock pulse and the second measurement clock pulse.

12. The time-to-digital (TDC) device according to claim 10, wherein the delay line (DL) inject block comprises a first DL inject subblock and a second DL inject subblock, wherein the first DL inject block comprises the first trigger input, a first DL clock input connected to the clock input, the first delay line output and the first sampling output, and wherein the second DL inject subblock comprises the second trigger input, a second DL clock input connected to the clock input, the second delay line output and the second sampling output.

13. The time-to-digital (TDC) device according to claim 9, wherein the first register and/or the second register is a strongARM latch register.

14. The time-to-digital (TDC) device according to claim 9, wherein a clock tree is used to equally distribute the sampling signal to the register.

15. The time-to-digital (TDC) device according to claim 9, wherein the TDC comprises a power stabilizer for stabilizing the power provided to the delay cells of the delay line.

16. The time-to-digital (TDC) device according to claim 9, wherein the delay line is powered by a low dropout regulator (LDO) which is digitally trimmed to output an adaptable supply voltage to the delay line cells.

17. The time-to-digital (TDC) device according to claim 16, wherein the LDO is configured to provide the delay line with a power which depends on the measured calibration amount of delay cells and/or on the computed conversion step size.

18. The time-to-digital (TDC) device according to claim 9, wherein the step of basing the delay line signal on a clock signal received at the clock input and providing said delay line signal based on the clock signal to the delay line, is performed within half a clock period of said measurement clock pulse.

19. The time-to-digital (TDC) device according to claim 9, wherein the delay line comprises a linear chain of delay cells, each delay cell in the chain being configured to pass a signal received at an input of the delay cell to the following delay cell in the delay line after a delay time.

* * * * *